US009219097B2

(12) United States Patent
Ha et al.

(10) Patent No.: US 9,219,097 B2
(45) Date of Patent: *Dec. 22, 2015

(54) METHOD FOR PRODUCTION OF SOLID-STATE IMAGING ELEMENT, SOLID-STATE IMAGING ELEMENT, AND IMAGING APPARATUS

(71) Applicant: Sony Corporation, Tokyo (JP)

(72) Inventors: Sanghoon Ha, Kanagawa (JP); Hiroaki Ishiwata, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/144,927

(22) Filed: Dec. 31, 2013

(65) Prior Publication Data

US 2014/0110762 A1   Apr. 24, 2014

Related U.S. Application Data

(63) Continuation of application No. 13/116,539, filed on May 26, 2011, now Pat. No. 8,697,477.

(30) Foreign Application Priority Data

Jun. 2, 2010   (JP) ................ 2010-127324

(51) Int. Cl.
*H01L 31/062*   (2012.01)
*H01L 27/148*   (2006.01)
*H01L 27/146*   (2006.01)
*H01L 31/18*   (2006.01)
(Continued)

(52) U.S. Cl.
CPC .... *H01L 27/14806* (2013.01); *H01L 27/14616* (2013.01); *H01L 27/14689* (2013.01);
(Continued)

(58) Field of Classification Search
CPC ................................ H01L 27/14643
USPC ................. 257/292, 291, 443, 461
See application file for complete search history.

(56) References Cited

U.S. PATENT DOCUMENTS

| | | | |
|---|---|---|---|
| 8,697,477 B2 * | 4/2014 | Ha et al. ............ | 438/73 |
| 2002/0175355 A1 | 11/2002 | Shim | |
| 2011/0156104 A1 | 6/2011 | Yamaguchi | |

FOREIGN PATENT DOCUMENTS

| | | |
|---|---|---|
| CN | 102110702 A | 6/2011 |
| JP | 2002-373978 | 12/2002 |

(Continued)

OTHER PUBLICATIONS

Chinese Office Examination Report issued in connection with related Chinese Patent Application No. 201110137693.6 dated Nov. 18, 2014 with English translation.

*Primary Examiner* — Reema Patel
(74) *Attorney, Agent, or Firm* — Hazuki International, LLC

(57) ABSTRACT

A method for producing a solid-state imaging element which has photoconversion pixels, the method including forming an impurity region of the first conduction type and a second impurity region of the second conduction type on the impurity region of the first conduction type by ion implantation by using the same mask; forming on the surface of the semiconductor substrate a transfer gate constituting the charge transfer section which extends over the second impurity region of the second conduction type; forming a charge accumulating region of the first conduction type constituting the sensor section by ion implantation; and forming a first impurity region of the second conduction type, which has a higher impurity concentration than the second impurity region of the second conduction type, by ion implantation.

10 Claims, 16 Drawing Sheets

(51) Int. Cl.
*H01L 31/0352* (2006.01)
*H01L 31/103* (2006.01)

(52) U.S. Cl.
CPC ........ *H01L31/03529* (2013.01); *H01L 31/103* (2013.01); *H01L 31/18* (2013.01); *H01L 27/14643* (2013.01); *Y02E 10/50* (2013.01)

(56) References Cited

FOREIGN PATENT DOCUMENTS

| | | |
|---|---|---|
| JP | 2004-273913 | 9/2004 |
| JP | 2005-223134 | 8/2005 |

\* cited by examiner

F I G . 5
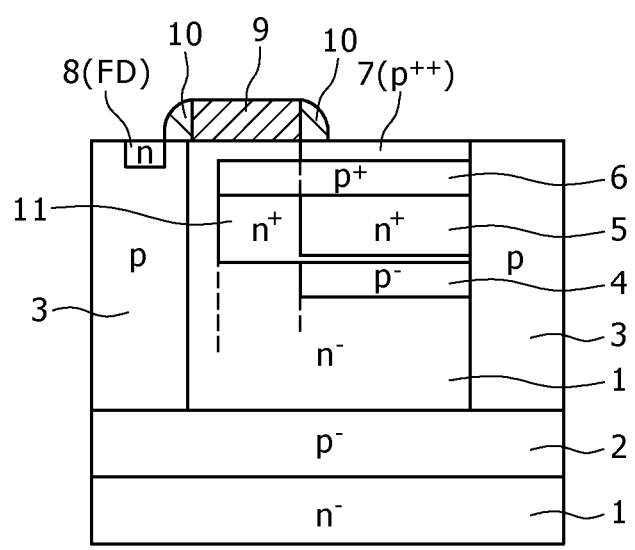

METHOD FOR PRODUCTION OF SOLID-STATE IMAGING ELEMENT, SOLID-STATE IMAGING ELEMENT, AND IMAGING APPARATUS

RELATED APPLICATION DATA

This application is a continuation of U.S. patent application Ser. No. 13/116,539 filed May 26, 2011, the entirety of which is incorporated herein by reference to the extent permitted by law. The present application claims the benefit of priority to Japanese Patent Application No. JP 2010-127324 filed on Jun. 2, 2010 in the Japan Patent Office, the entirety of which is incorporated by reference herein to the extent permitted by law.

BACKGROUND

The present disclosure relates a method for production of a solid-state imaging element, a solid-state imaging element, and an imaging apparatus equipped with said solid-state imaging element.

The recent trend in the field of CMOS (Complementary Metal Oxide Semiconductor) image sensor is toward multiplication of pixels and size reduction of pixels. Unfortunately, the size reduction of pixels is accompanied by a remarkable deterioration of pixel characteristics.

There has been proposed an idea of ion-implantation into individual pixels for the purpose of maintaining or improving such pixel characteristics as saturation charge amount (Qs), charge transfer, white spots, and sensitivity. (See Japanese Patent Laid-open No. 2005-223134, Japanese Patent Laid-open No. 2002-373978, Japanese Patent Laid-open No. 2004-273913, hereinafter referred to as Patent Documents 1 to 3, for example.)

The ion implantation into pixels adds new impurity regions to the existing structure, thereby controlling the potential distribution and improving the pixel characteristics.

The proposed way for improvement adds new impurity regions and hence makes the pixel structure more complex. This increases the number of fabricating steps and raises the production cost, which leads to a cost increase of image sensor chips.

SUMMARY

The structure disclosed in Patent Documents 1 to 3 listed above is intended to cope with the deterioration in pixel characteristics which is accompanied by the size reduction of pixels. Another possible structure is the one shown in FIG. 16, which is a schematic sectional view of a solid-state imaging element.

The solid-state imaging element shown in FIG. 16 is constructed such that each pixel is isolated by the p-type element separating regions 53 and the space within the element isolating regions 53 holds the photodiode (PD) as the sensor section and the charge transfer section. In this figure, the reference numeral 51 denotes the semiconductor substrate (with or without a semiconductor epitaxial layer thereon) and the reference numeral 52 denotes the semiconductor well region of $p^-$ type which is embedded in the semiconductor substrate 51.

This solid-state imaging element has the photodiode which is characterized in that the region 56 of $p^+$ type (which has a lower impurity concentration than the positive charge accumulating region 58) is formed between the charge accumulating region 59 of $n^+$ type and the positive charge accumulating region 58 of $p^{++}$ type (which is formed on the surface and is intended to suppress dark current). The region 56 of $p^+$ type extends from the photodiode to a portion under the transfer gate 60.

The positive charge storage region 58 enhances pinning at the side of the transfer gate 60 and stores the saturation charge amount (Qs). However, it alone is not enough for pinning under the transfer gate 60, which causes a problem with white spots. The region 56 of $p^+$ type, which extends under the transfer gate 60, enhances pinning under the transfer gate 60.

However, simply adding the region 56 of $p^+$ type makes it difficult to modulate the potential under the transfer gate 60, which results in a transfer barrier.

For this reason, the region 57 of $n^-$ type is added to assist the potential modulation when the transfer gate 60 is on. The region 57 of $n^-$ type passes under the transfer gate 60 and extends to a portion under the n-type floating diffusion 59.

The region 57 of $n^-$ type, which is formed as mentioned above, improves the charge transfer.

Under the charge accumulating region 55 is formed the region 54 of $p^-$ type having a low impurity concentration. It raises the overflow barrier (OFB) between the photodiode and the floating diffusion, thereby increasing the saturation charge amount (Qs) of the photodiode.

The solid-state imaging element mentioned above is produced by ion implantation into individual impurity regions. FIGS. 17A to 17C show the steps for ion implantation which is carried out for production of the solid-state imaging element shown in FIG. 16. Incidentally, FIGS. 17A to 17C do not show the element separating region 53 of p type which isolates the pixels from one another.

As shown in FIG. 17A, the region 57 of $n^-$ type is formed by ion implantation with n-type impurity and the region 56 of $p^+$ type is formed by ion implantation with p-type impurity.

As shown in FIG. 17B, the transfer gate 60 is formed and then the region 54 of $p^-$ type and the charge accumulating region 55 of $n^+$ type are sequentially formed by ion implantation respectively with p-type impurity and n-type impurity. This ion implantation employs the transfer gate 60 as the mask.

The side walls 61 (of insulating layer) are formed on the sides of the transfer gate 60, and then the floating diffusion 59 of n type and the positive charge accumulating region 58 of $p^{++}$ are sequentially formed. This step employs the side walls 61 as the mask.

Finally, the element separating regions 53 are formed. In this way there is obtained the solid-state imaging element as shown in FIG. 16.

Incidentally, the element separating region 53 may be formed before the impurity regions are formed.

FIGS. 18A to 18C show the steps of ion implantation with partial modification to those shown in FIGS. 17A to 17C.

The step shown in FIG. 18A is to form the region 57 of $n^-$ type and the region 56 of $p^+$ type in the same way as in the step shown in FIG. 17A.

The step shown in FIG. 18B is to form the transfer gate 60 and the side walls 61 therefor, and then to form the region 54 of $p^-$ type and the charge accumulating region 55 of $n^+$ type by using the side walls 61 as the mask.

The step shown in FIG. 18C is to sequentially form the floating diffusion 59 of n type and the positive charge accumulating region 58 of $p^{++}$ type by using the side walls 61 as the mask. Finally, the element separating region 53 is formed.

The resulting solid-state imaging element differs from the one shown in FIG. 16 in that the left end of the charge accumulating region 55 and the region 54 of $p^-$ type is displaced rightward as much as the width of the side wall 61.

The disadvantage of the steps shown in FIGS. 17A to 17C and 18A to 18C is that the region 54 of p⁻ type, the charge accumulating region 55, the region 57 of n⁻ type, and the region 56 of p⁺ type need different masks for ion implantation to form their impurity regions because they differ from one another in their impurity regions.

Use of different masks increases more fabricating steps, which raises the production cost of image sensor chips.

Moreover, the potential gradient under the transfer gate 60 is affected by misalignment at the time of ion implantation and this makes it necessary to carry out photolithography accurately for mask making.

In addition, the size reduction of pixels will need the shortening of the transfer gate and the enlargement of the effective area of the photodiode for improvement of sensitivity and maintenance or improvement of saturation charge amount (Qs).

Unfortunately, the shortening of the transfer gate requires a higher accuracy for mask alignment when the impurity region is formed. This increases the number of carrying out photolithography, leading to be a problem for productivity.

The miniaturized pixel causes the field intensity to increase between the impurity regions when the number of the impurity regions increase in the pixel part. The increased field intensity induces leakage from the pn junction, thereby causing white spots.

To solve the foregoing problems, it is a desire of the present disclosure to provide a method for production of a solid-state imaging element, a solid-state imaging element, and an imaging apparatus equipped with the solid-state imaging element. The method can produce the solid-state imaging element, which has improved pixel characteristics, at a low production cost.

According to an embodiment of the present disclosure, there is provided a method for production of a solid-state imaging element which has pixels, each including a sensor section that performs photoelectric conversion and a charge transfer section that transfers charges generated by the sensor section. The method includes:

forming in a semiconductor substrate an impurity region of the first conduction type and a second impurity region of the second conduction type on the impurity region of the first conduction type by ion implantation by using the same mask;

forming on the surface of the semiconductor substrate a transfer gate constituting the charge transfer section which extends over the second impurity region of the second conduction type;

forming in the semiconductor substrate a charge accumulating region of the first conduction type constituting the sensor section by ion implantation; and forming on the surface of the semiconductor substrate of the sensor section a first impurity region of the second conduction type, which has a higher impurity concentration than the second impurity region of the second conduction type, by ion implantation.

According to another embodiment of the present disclosure, there is provided a solid-state imaging element having pixels, each including a sensor section that performs photoelectric conversion and a charge transfer section that transfers charges generated by the sensor section. The solid-state imaging element includes:

a semiconductor substrate;

a transfer gate constituting the charge transfer section on the surface of the semiconductor substrate;

a charge accumulating region of the first conduction type which constitutes the sensor section;

a first impurity region of the second conduction type which is formed on the surface of the semiconductor substrate at the sensor section;

a second impurity region of the second conduction type which has a lower impurity concentration than the first impurity region of the second conduction type, the second impurity region being formed on the charge accumulating region and under the first impurity region of the second conduction type and extending under the transfer gate; and an impurity region of the first conduction type which is formed by self-alignment with the second impurity region of the second conduction type.

According to further embodiment of the present disclosure, there is provided an imaging apparatus including:

a light collecting section configured to collect incident light;

a solid-state imaging element having pixels, each including a sensor section that performs photoelectric conversion and a charge transfer section that transfers charges generated by the sensor section, the solid-state imaging element including a semiconductor substrate, a transfer gate constituting the charge transfer section on the surface of the semiconductor substrate, a charge accumulating region of the first conduction type which constitutes the sensor section, a first impurity region of the second conduction type which is formed on the surface of the semiconductor substrate at the sensor section, a second impurity region of the second conduction type which has a lower impurity concentration than the first impurity region of the second conduction type, the second impurity region being formed on the charge accumulating region and under the first impurity region of the second conduction type and extending under the transfer gate, and an impurity region of the first conduction type which is formed by self-alignment with the second impurity region of the second conduction type; and a signal processing section configured to process signals resulting from photoelectric conversion by the solid-state imaging element.

According to the present disclosure, the method for producing the solid-state imaging element includes a step of forming an impurity region of the first conduction type and a second impurity region of the second conduction on the impurity region of the first conduction type by ion implantation through the same mask. In this way the impurity region of the first conduction type and the second impurity region of the second conduction type are formed by self-alignment. In addition, the ion implantation for the two regions is accomplished through the same mask. Ion implantation in this way reduces the number of masks and fabricating steps and also permits a large margin for mask alignment.

Moreover, the transfer gate constituting the charge transfer section is formed over the second impurity region of the second conduction type. Thus, the impurity region of the first conduction type and the second impurity region of the second conduction type are so formed as to extend under the transfer gate. In other words, the second impurity region of the second conduction type extends under the transfer gate, which results in enhanced pinning by the transfer gate. In addition, the impurity region of the first conduction type extends under the transfer gate at the charge transfer section. This permits the modulation of the impurity region of the first conduction type and prevents the occurrence of transfer barrier by the second impurity region. The result is improvement in charge modulation and improvement in pixel characteristics of the solid-state imaging element.

The solid-state imaging element according to the present disclosure has a first impurity region of the second conduction type and a second impurity region of the second conduction type (with the latter being lower in impurity concentration than the former) which are formed above the charge accumulating region and under the first impurity region of the second conduction type. The second impurity region of the second conduction type is formed self-alignment with the impurity region of the first conduction type.

The fact that the second impurity region of the second conduction type is formed by self-alignment with the impurity region of the first conduction type permits the second impurity region and the impurity region of the first conduction type to be formed by ion implantation through the same mask. This helps reduce the number of masks and fabricating steps in production of the solid-state imaging element and also permits a larger margin for mask alignment.

Moreover, the second impurity region of the second conduction type extends under the transfer gate of the charge transfer section, and the impurity region of the second conduction type is formed by self-alignment with the second impurity region of the second conduction type. The fact that the second impurity region of the second conduction type extends under the transfer gate permits enhanced pinning by the transfer gate. In addition, the impurity region of the first conduction type also extends under the transfer gate of the charge transfer section. This permits modulation of the impurity region of the first conduction type and suppresses the occurrence of transfer barrier by the second impurity region. The result is improvement in charge modulation and pixel characteristics.

The imaging apparatus according to the present disclosure is equipped with the solid-state imaging element according to the present disclosure. Therefore, the solid-state imaging element is produced with a less number of fabricating steps and has improved pixel characteristics.

The present disclosure permits one to produce the solid-state imaging element with a less number masks and fabricating steps and with a larger margin for mask alignment.

This leads to time saving and improved yields.

The present disclosure also provides a superior solid-state imaging element with improved charge transfer and improved pixel characteristics.

It also permits production of a solid-state imaging element having more pixels and smaller size than before by size reduction of pixels without adverse effects on the pixel characteristics.

Thus, the present disclosure helps produce economically an imaging apparatus equipped with a solid-stage imaging element capable of stable and reliable operation.

BRIEF DESCRIPTION OF THE DRAWINGS

FIG. 5 is a schematic sectional view showing the structure of the solid-state imaging element according to the third embodiment of the present disclosure;

DETAILED DESCRIPTION OF THE PREFERRED EMBODIMENTS

Described below is the best mode for carrying out the disclosure (which will be referred to as embodiments hereinafter). The description will proceed in the following order.
1. First embodiment (solid-state imaging element)
2. Second embodiment (solid-state imaging element)
3. Third embodiment (solid-state imaging element)
4. Fourth embodiment (solid-state imaging element)
5. Fifth embodiment (solid-state imaging element)
6. Sixth embodiment (solid-state imaging element)
7. Seventh embodiment (solid-state imaging element)
8. Eighth embodiment (imaging apparatus)

1. First Embodiment

Figure 1:
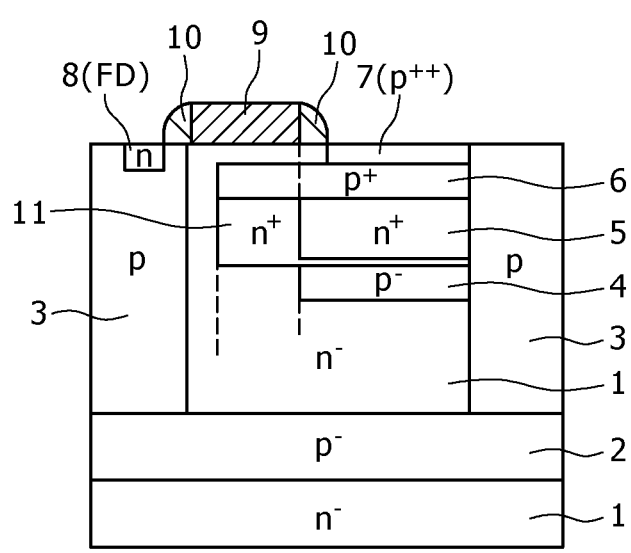
FIG. 1 is a schematic sectional view showing the structure of the solid-state imaging element according to the first embodiment of the present disclosure.

The solid-state imaging element according to the first embodiment of the present disclosure has a structure as shown in FIG. 1 which is a schematic sectional view.

This solid-state imaging element is composed of the $n^-$-type semiconductor substrate 1 of silicon or any other semiconductor material and those components formed thereon which include the photodiode (PD) as the sensor, the transfer gate 9 for the charge transfer section, and the floating diffusion (FD) 8.

The semiconductor substrate 1 may be that of silicon or the one with a semiconductor epitaxial layer formed thereon.

The semiconductor substrate 1 has the P⁻-type semiconductor well region 2 embedded therein. This semiconductor well region 2 is so formed as to cover the entire pixel region or to cover the entire chip surface of the solid-state imaging element, and it separates the pixel section from the substrate.

Those components above the semiconductor well region 2 are constructed such that the pixels are separated from one another by the p-type element separating region 3. In that section which is separated by the element separating region 3 are formed the photodiode (PD) as the sensor section and the charge transfer section.

The photodiode has the charge accumulating region 5 of n⁺ type, the region 6 of p⁺ type, and the positive charge accumulating region 7 of p⁺⁺ type for suppressing dark current formed on the surface. The region 6 of p⁺ type has a lower impurity concentration than the positive charge accumulating region 7.

Under the charge accumulating region 5 is the region 4 of p⁻ type with a low concentration. The region 4 of p⁻ type should preferably have a lower impurity concentration than the charge accumulating region 5 so that it has a large amount of saturation charge (Qs).

The charge transfer section has the transfer gate 9 which is formed on the surface of the semiconductor substrate 1, with a thin gate insulating film (not shown) interposed between them. This transfer gate 9 is flanked with the side walls 10 of insulating layer.

This transfer gate 9 may be formed from polycrystalline silicon, for example.

On the surface of the element separating region 3 shown in FIG. 1 is formed the floating diffusion (FD) 8 of n type. The floating diffusion 8 and the positive charge accumulating region 7 for the sensor section are formed outside the side wall 10 of the transfer gate 9.

The transfer gate 9 mediates charge transfer between the photodiode and the floating diffusion 8. The floating diffusion 8 accumulates the transferred charges.

The impurity-containing regions vary in impurity concentration from one another. For example, the semiconductor well region 2 has an order of $10^{10}/cm^{-3}$, the element separating region 3 has an order of $10^{12}/cm^{-3}$, and the region 4 of p⁻ type has an order of $10^{11}/cm^{-3}$ to $10^{12}/cm^{-3}$.

This embodiment is characterized in that the region 6 of p⁺ type on the charge accumulating region 5 extends under the transfer gate 9. The region 6 of p⁺ type which extends under the transfer gate 9 enhances pinning under the transfer gate 9 as in the structure shown in FIG. 16.

Also, this embodiment is characterized in that the region 11 of n⁺ type (which is under the transfer gate 9) is formed in the left part adjacent to the charge accumulating region 5.

The region 11 of n⁺ type improves the transfer of charges from the photodiode to the floating diffusion 8.

It is formed by self-alignment with the region 6 of p⁺ type, such that its left edge coincides with the left edge of the region 6 and its right edge coincides with the boundary of the element separating region 3, as indicated by broken lines.

Incidentally, the region 11 of n⁺ type partly overlaps with the charge accumulating region 5.

The fact that the region 11 of n⁺ type and the region 6 of p⁺ type thereon are formed by self-alignment permits ion implantation to be performed sequentially by using the same mask (as mentioned later), and this helps reduce the number of masks.

The region 11 of n⁺ type should have an impurity concentration which is approximately equal to or lower or higher than that in the charge accumulating region 5. The impurity concentration in the charge accumulating region 5 and the region 11 of n⁺ type should be properly established according to the required characteristics of the pixel. In other words, the region 11 of n⁺ type should have an impurity concentration high enough for proper charge transfer, and the charge accumulating region 5 should have an impurity concentration high enough to ensure the amount of saturation charges (Qs).

The region 4 of p⁻ type is formed by self-alignment with the charge accumulating region 5. The region 4 of p⁻ type and the charge accumulating region 5 are formed such that their left edges coincide with each other as indicated by the broken line, and their right edges also coincide with each other at the boundary of the element separating region 3.

The fact that the region 4 of p⁻ type and the charge accumulating region 5 are formed by self-alignment permits ion implantation to be performed sequentially by using the same mask (as mentioned later), and this helps reduce the number of masks.

The solid-state imaging element according to this embodiment can be produced by the process explained below. Incidentally, detailed descriptions are omitted for those steps other than ion implantation which can be carried out in the same way as for existing solid-state imaging elements.

Figure 2A:
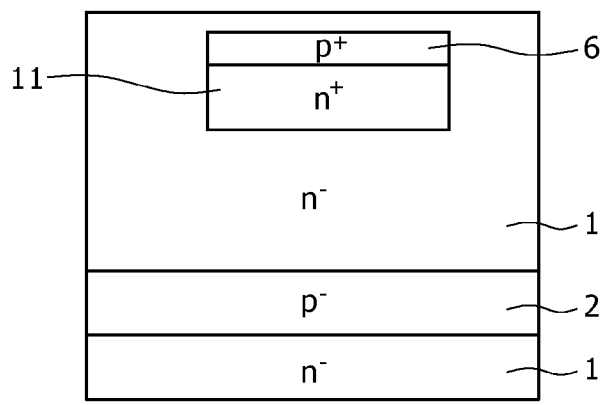
FIGS. 2A to 2C are diagrams showing the processing steps for production of the solid-state imaging element shown in FIG. 1.

The first step starts with forming the region 11 of n⁺ type and the region 6 of p⁺ type by ion implantation respectively with n-type impurity and p-type impurity through the same mask, as shown in FIG. 2A.

In this way the region 11 of n⁺ type and the region 6 of P⁺ type are formed by self-alignment.

Although the region of n⁺ type and the region of p⁺ type completely overlap with each other immediately after ion implantation, their edges become slightly displaced later as the result of diffusion by heating to activate the impurities. The amount of displacement may be limited to tens of nanometers. Incidentally, since the p-type impurity for the region 6 of p⁺ type diffuses faster than the n-type impurity for the region 11 of n⁺ type, that part under the transfer gate 9 is certainly covered with the region 6 of p⁺ type.

Figure 2B:
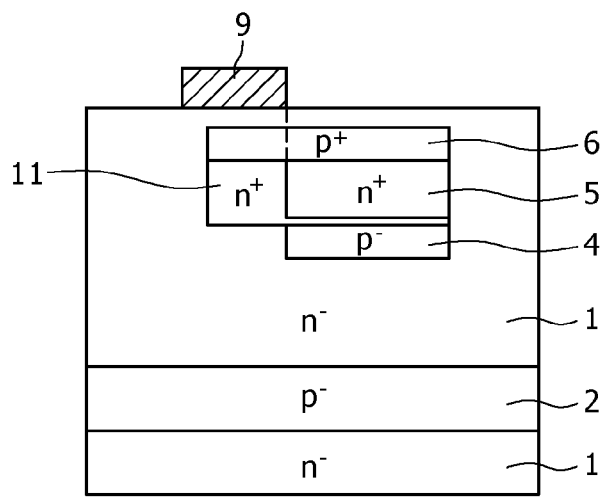

The next step is to form the transfer gate 9 and then to form the region 4 of p⁻ type and the charge accumulating region 5 by ion implantation respectively with p-type impurity and n-type impurity through the transfer gate 9 as the same mask, as shown in FIG. 2B. It is desirable that the dose of p-type impurity in the region 4 of p⁻ type is smaller than the dose of n-type impurity in the charge accumulating region 5 so that the former has a lower impurity concentration than the latter.

Incidentally, the transfer gate 9 is so formed as to partly cover the region 11 of n⁺ type and the region 6 of p⁺ type. In other words, the region 11 of n⁺ type and the region 6 of p⁺ type extend under the transfer gate 9.

Figure 2C:
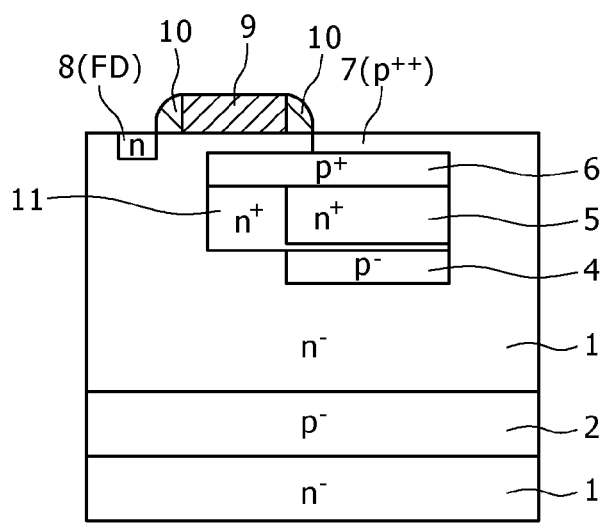

Subsequently, the side walls 10 are formed on the sides of the transfer gate 9, and the n-type floating diffusion 8 and the positive charge accumulating region 7 of p⁺⁺ type are sequentially formed by using the side walls 10 as the mask, as shown in FIG. 2C.

Finally, the element separating regions 3 are formed. In this way there is obtained the solid-state imaging element shown in FIG. 1.

Incidentally, the element separating regions 3 may be formed before the impurity regions 4, 5, 6, 7, 8, and 11 are formed.

The processing steps mentioned above differ from those shown in FIGS. 17A to 17C (for the solid-state imaging element shown in FIG. 16) in that two steps each for ion implantation employ the same mask. Ion implantation which was repeated twice by using the same mask saves the number of masks and the number of steps and also allows a large margin for alignment.

According to this embodiment, the region 11 of $n^+$ type and the region 6 of $p^+$ type thereon are formed by self-alignment. In other words, they can be formed by ion implantation by using the same mask.

Similarly, the region 4 of $p^-$ type and the charge accumulating region 5 thereon are formed by self-alignment. In other words, they can be formed by ion implantation by using the same mask.

The process mentioned above offers the advantage of reducing the number of masks and fabricating steps and increasing alignment margins.

This contributes to cost reduction, time saving, and improved yields.

The fact that the region 11 of $n^+$ type and the region 6 of $p^+$ type extend to a portion under the transfer gate 9 enhances pinning under the transfer gate 9.

In addition, the fact that the region 11 of $n^+$ type extends to a portion under the transfer gate 9 helps the region 11 of $n^+$ type to be modulated and contributes to potential modulation when the transfer gate 9 is on. It also permits the region 11 of $n^+$ type to prevent the transfer barrier from occurring due to the region 6 of $p^+$ type. This improves charge transfer by the region 11 of $n^+$ type, or even permits complete transfer. The region 11 of $n^+$ type plays the same role as the region 57 of $n^-$ type shown in FIG. 16 and hence obviates the necessity for it.

Moreover, the region 11 of $n^+$ type helps eliminate white spots and improve dark characteristics.

The dose in the region 11 of $n^+$ type may be established arbitrarily because it is not necessarily equal to the dose in the charge accumulating region 5.

The properly adjusted dose in the region 11 of $n^+$ type helps improve the potential gradient under the transfer gate 9. With the potential gradient properly improved under the transfer gate 9, it is possible to reduce the number of electrons existing under the transfer gate 9 when the transfer gate 9 is on, thereby preventing electrons from being captured by traps existing in the interface under the transfer gate 9. This leads to improvement in the dark characteristics.

If the impurity concentration in the region 11 of $n^+$ type is to be higher than that in the charge accumulating region 5, the dose in the region 11 of $n^+$ type should be higher than that in the charge accumulating region 5.

If the impurity concentration in the region 11 of $n^+$ type is to be equal to that in the charge accumulating region 5, the dose in the region 11 of $n^+$ type should be equal to that in the charge accumulating region 5.

If the impurity concentration in the region 11 of $n^+$ type is to be lower than that in the charge accumulating region 5, the dose in the region 11 of $n^+$ type should be lower than that in the charge accumulating region 5.

The region 4 of $p^-$ type, which is formed under the charge accumulating region 5, helps raise OFB between the photodiode and the floating diffusion, thereby increasing the saturation charge amount (Qs) of the photodiode.

Although the solid-state imaging element according to the embodiment shown in FIG. 1 has one photodiode and one floating diffusion for each pixel, it may be so modified as to have one floating diffusion (FD) for more than one pixel (two or four pixels, for example).

In this case, the relative position of the floating diffusion (FD) and the pixel differs from that in the case where there is one FD for one pixel. In other words, the position of FD relative to the photodiode (PD) differs from one pixel to another.

This causes dislocation to occur between the FD (which is formed in conformity with the transfer gate) and the charge accumulating region of the PD. The result is that the FD-PD distance varies among several pixels possessing the FD in common. Such pixels are not uniform in characteristic properties such as saturation charge amount (Qs).

Since the solid-state imaging element according to this embodiment is constructed such that the region 4 of $p^-$ type is formed under the charge accumulating region 5, it is possible to reduce variation of pixel characteristics (such as Qs) even though a plurality of pixels possess in common one floating diffusion (FD) 8.

2. Second Embodiment

Figure 3:
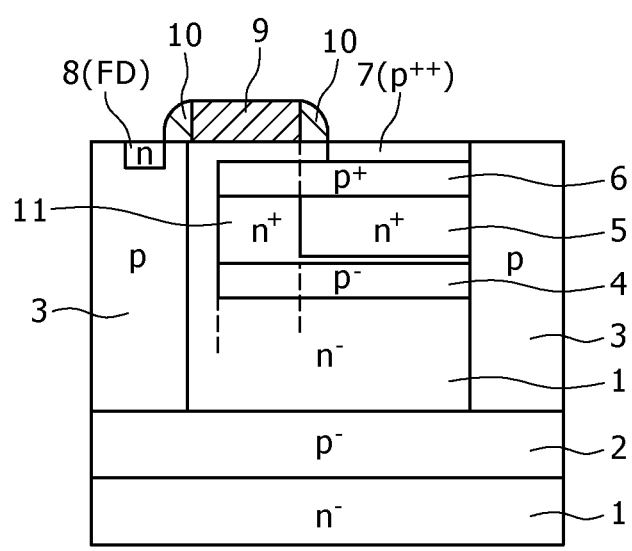
FIG. 3 is a schematic sectional view showing the structure of the solid-state imaging element according to the second embodiment of the present disclosure.

The solid-state imaging element according to the second embodiment of the present disclosure has a structure as shown in FIG. 3 which is a schematic sectional view. It is constructed such that the region 4 of $p^-$ type extends under the region 11 of $n^+$ type which is under the transfer gate 9. In addition, the region 4 of $p^-$ type is formed by self-alignment with the region 11 of $n^+$ type and the region 6 of $p^+$ type. Except for this structure, it is identical with the one (shown in FIGS. 1 and 2) according to the first embodiment. The same constituents indicated by identical reference numerals and their description is omitted.

The solid-state imaging element according to this embodiment can be produced by the process explained below.

Figure 4A:
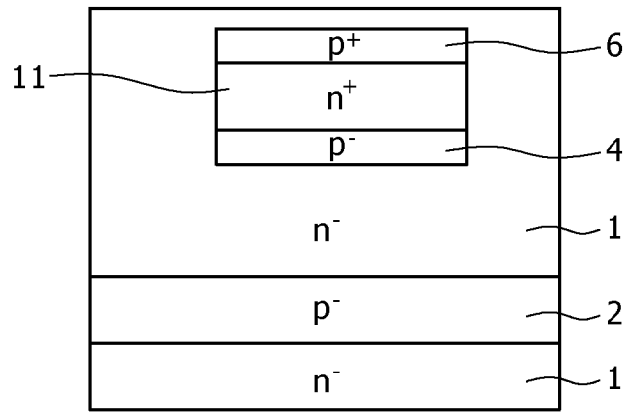
FIGS. 4A to 4C are diagrams showing the processing steps for production of the solid-state imaging element shown in FIG. 3.

The first step starts with forming the region 4 of $p^-$ type by ion implantation with p-type impurity, the region 11 of $n^+$ type by ion implantation with n-type impurity, and the region 6 of $p^+$ type by ion implantation with p-type impurity through the same mask, as shown in FIG. 4A.

In this way there are formed the region 4 of $p^-$ type, the region 11 of $n^+$ type, and the region 6 of $P^+$ type by self-alignment.

Although the region of $p^-$ type, the region of $n^+$ type, and the region of $p^+$ type completely overlap with one another immediately after ion implantation, their edges become slightly displaced later as the result of diffusion by heating to activate the impurities. The amount of displacement may be limited to tens of nanometers.

Figure 4B:
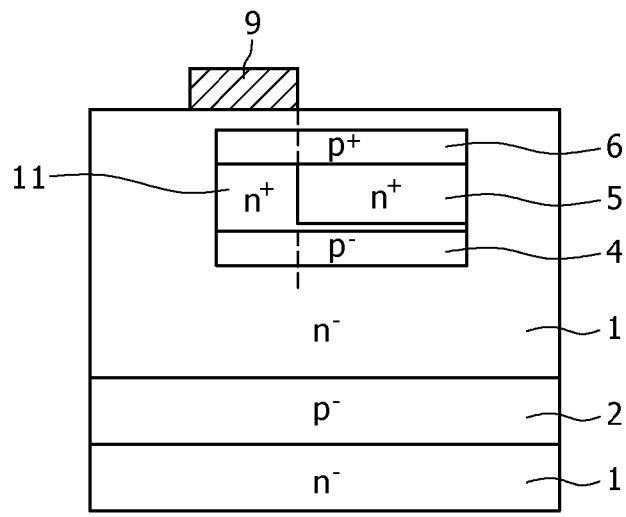

The next step is to form the transfer gate 9 and then to form the charge accumulating region 5 by ion implantation with n-type impurity by using the transfer gate 9 as the mask, as shown in FIG. 4B. Incidentally, the transfer gate 9 is so formed as to extend over the region 11 of $n^+$ type and the region 6 of $p^+$ type, so that the region 11 of $n^+$ type and the region 6 of $p^+$ type extend under the transfer gate 9.

Figure 4C:
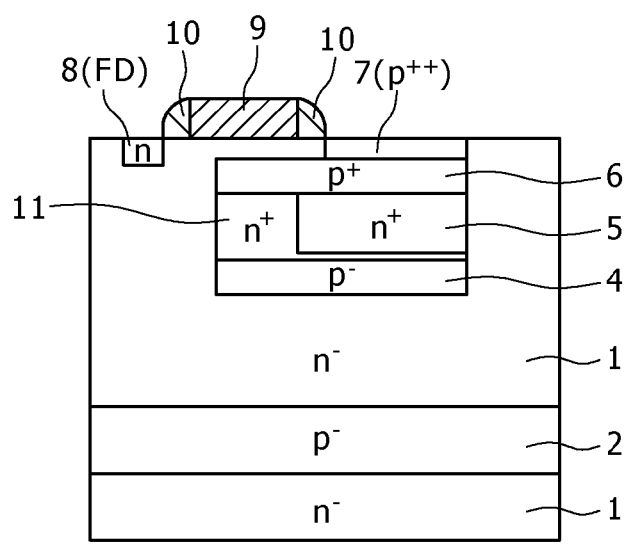

Subsequently, the side walls 10 are formed on the sides of the transfer gate 9, and the n-type floating diffusion 8 and the positive charge accumulating region 7 of $p^{++}$ type are sequentially formed by using the side walls 10 as the mask, as shown in FIG. 4C.

Finally, the element separating regions 3 are formed. In this way there is obtained the solid-state imaging element shown in FIG. 3. Incidentally, the element separating regions 3 may be formed before the impurity regions 4, 5, 6, 7, 8, and 11 are formed.

The processing steps mentioned above differ from those shown in FIGS. 17A to 17C (for the solid-state imaging element shown in FIG. 16) in that three steps each for ion implantation employ the same mask. Ion implantation which was repeated three times by using the same mask saves the number of masks and the number of steps and also allows a large margin for alignment.

Like the first embodiment, the second embodiment is characterized in that the region 11 of $n^+$ type and the region 6 of $p^+$ type thereon are formed by self-alignment and they extend under the transfer gate 9.

In addition, the second embodiment is characterized in that the region 4 of p⁻ type is also formed by self-alignment with the region 11 of n⁺ type and the region 6 of p⁺ type.

This structure permits the solid-state imaging element to be produced with a less number of masks and fabricating steps and also with a larger margin for mask alignment.

This contributes to cost reduction, time saving, and improved yields.

As in the first embodiment, the solid-state imaging element according to the second embodiment is capable of enhanced pinning under the transfer gate 9, which leads to improved charge transfer. Consequently, it obviates the necessity for the region 57 of n⁻ type shown in FIG. 16.

In addition, the region 11 of n⁺ type contributes to improved white spots and dark characteristics.

Moreover, the region 4 of p⁻ type, which is formed beneath the charge accumulating region 5, extends to a portion under the transfer gate 9 and helps increase OFB between the photodiode and the floating diffusion, thereby increasing the saturation charge amount (Qs) of the photodiode. This leads to a higher value of OFB as compared with the solid-state imaging element shown in FIG. 16.

The transfer gate 9 may be reduced in gate length without any adverse effect on transfer owing to modulation by the region 11 of n⁺ type and action of the region 4 of p⁻ type. This makes it possible to reduce the pixel size by shortening the gate length of the transfer gate 9.

The solid-state imaging element according to this embodiment may be constructed such that a plurality (say, two or four) of pixels possess in common one floating diffusion (FD).

According to this embodiment, the region 4 of p⁻ type is formed under the charge accumulating region 5, and it reduces variation of pixel characteristics (such as Qs) even though a plurality of pixels possess in common one floating diffusion (FD) 8.

3. Third Embodiment

The solid-state imaging element according to the third embodiment of the present disclosure has a structure as shown in FIG. 5 which is a schematic sectional view.

It is characterized in that the positive charge accumulating region 7 on the surface of the sensor section is formed by self-alignment with the region 4 of p⁻ type and the charge accumulating region 5, and that these three regions 4, 5, and 7 are aligned with the right end of the transfer gate 9. Except for this structure, it is identical with the one (shown in FIGS. 1 and 2) according to the first embodiment. The same constituents are indicated by identical reference numerals and their description is omitted.

The solid-state imaging element according to this embodiment can be produced by the process explained below.

Figure 6A:
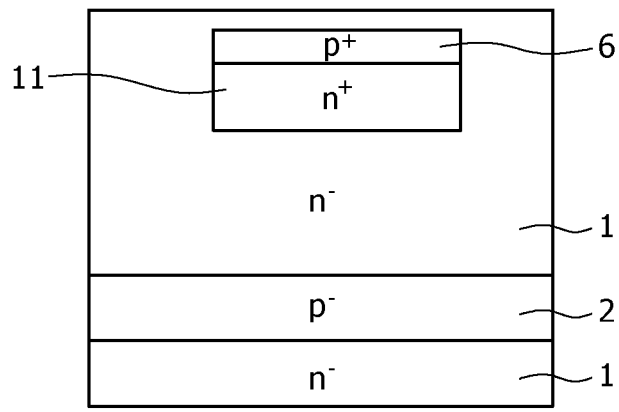
FIGS. 6A to 6C are diagrams showing the processing steps for production of the solid-state imaging element shown in FIG. 5.

The first step shown in FIG. 6A is identical with that shown in FIG. 2A. That is, the first step starts with forming the region 11 of n⁺ type by ion implantation with n-type impurity and the region 6 of p⁺ type by ion implantation with p-type impurity through the same mask.

In this way there are formed the region 11 of n⁺ type and the region 6 of P⁺ type by self-alignment.

Figure 6B:
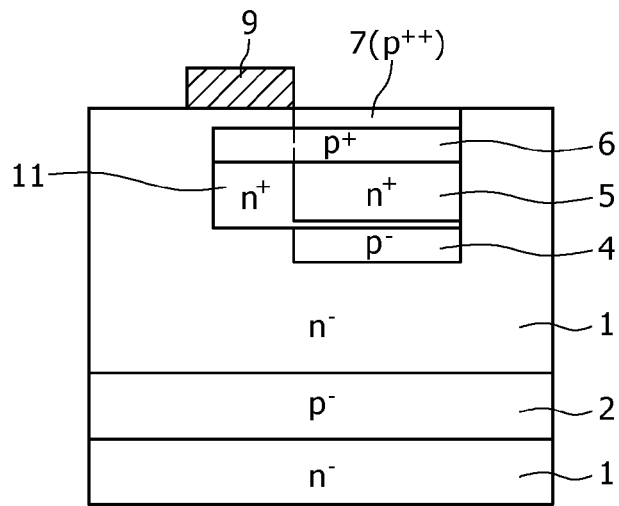

The next step is to form the transfer gate 9 and then to form the region 4 of p⁻ type by ion implantation with p-type impurity, the charge accumulating region 5 by ion implantation with n-type impurity, and the positive charge accumulating region 7 by ion implantation with p-type impurity by using the transfer gate 9 as the mask, as shown in FIG. 6B. Incidentally, the dose of p-type impurity for the region 4 of p⁻ type should preferably be smaller than that of n-type impurity for the charge accumulating region 5 so that the region 4 of p⁻ type is lower in impurity concentration than the charge accumulating region 5. In this way there are formed the region 4 of p⁻ type, the charge accumulating region 5, and the positive charge accumulating region 7 by self-alignment.

Incidentally, the transfer gate 9 is so formed as to extend over the region 11 of n⁺ type and the region 6 of p⁺ type, so that the region 11 of n⁺ type and the region 6 of p⁺ type extend under the transfer gate 9.

Figure 6C:
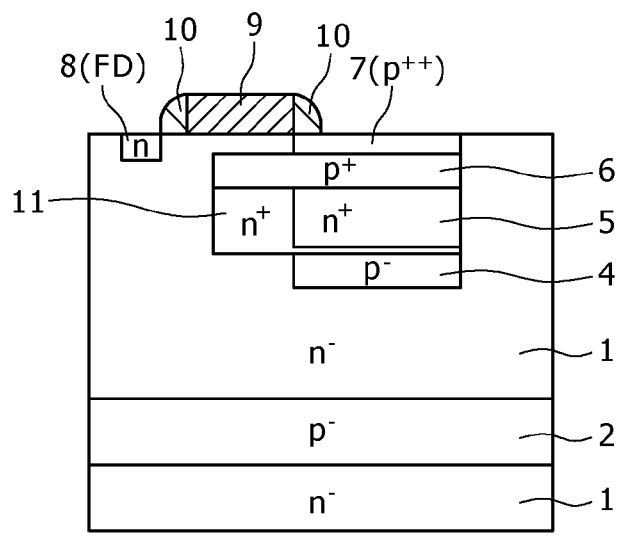

Subsequently, the side walls 10 are formed on the sides of the transfer gate 9, and the n-type floating diffusion 8 is formed by using the side walls 10 as the mask, as shown in FIG. 6C.

Finally, the element separating regions 3 are formed. In this way there is obtained the solid-state imaging element shown in FIG. 5.

Incidentally, the element separating regions 3 may be formed before the impurity regions 4, 5, 6, 7, 8, and 11 are formed.

The processing steps mentioned above are the same as those in the first embodiment; that is, the region 11 of n⁺ type and the region 6 of p⁺ type thereon are formed by self-alignment such that they extend under the transfer gate 9.

In addition, according to this embodiment, the region 4 of p⁻ type, the charge accumulating region 5, and the positive charge accumulating region 7 are formed by self-alignment.

This structure permits the solid-state imaging element to be produced with a less number of masks and processing steps and also with a larger margin for mask alignment.

This contributes to cost reduction, time saving, and improved yields.

As in the first embodiment, the solid-state imaging element according to the third embodiment is capable of enhanced pinning under the transfer gate 9, which leads to improved charge transfer. Consequently, it obviates the necessity for the region 57 of n⁻ type shown in FIG. 16.

In addition, the region 11 of n⁺ type contributes to improved white spots and dark characteristics.

The solid-state imaging element according to this embodiment may be constructed such that a plurality (say, two or four) of pixels possess in common one floating diffusion (FD).

According to this embodiment, the region 4 of p⁻ type is formed under the charge accumulating region 5, and it reduces variation of pixel characteristics (such as Qs) even though a plurality of pixels possess in common one floating diffusion (FD) 8.

4. Fourth Embodiment

Figure 7:
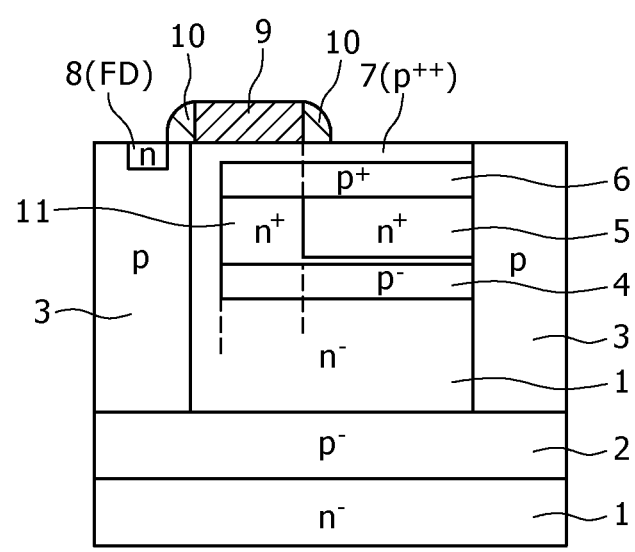
FIG. 7 is a schematic sectional view showing the structure of the solid-state imaging element according to the fourth embodiment of the present disclosure.

The solid-state imaging element according to the fourth embodiment of the present disclosure has a structure as shown in FIG. 7 which is a schematic sectional view.

According to this embodiment, the positive charge accumulating region 7 on the surface of the sensor section is formed by self-alignment with the charge accumulating region 5. In addition, these regions 5 and 7 are aligned with the right edge of the transfer gate 9.

Except for this structure, it is identical with the one (shown in FIGS. 3 and 4) according to the second embodiment. The same constituents in FIGS. 7 and 8 are indicated by identical reference numerals and their description is omitted.

The solid-state imaging element according to this embodiment can be produced by the process explained below.

Figure 8A:
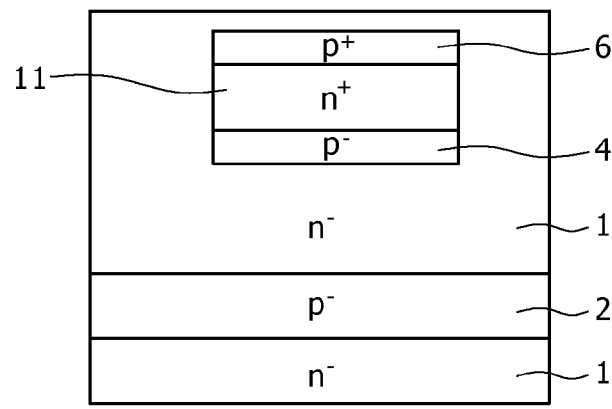
FIGS. 8A to 8C are diagrams showing the processing steps for production of the solid-state imaging element shown in FIG. 7.

The same steps as shown in FIG. 4A are carried out as shown in FIG. 8A. That is, the first step starts with forming the region 4 of p⁻ type by ion implantation with p-type impurity, the region 11 of n⁺ type by ion implantation with n-type impurity, and the region 6 of p⁺ type by ion implantation with p-type impurity through the same mask, as shown in FIG. 8A.

In this way there are formed the region 4 of p⁻ type, the region 11 of n⁺ type, and the region 6 of P⁺ type by self-alignment.

Figure 8B:
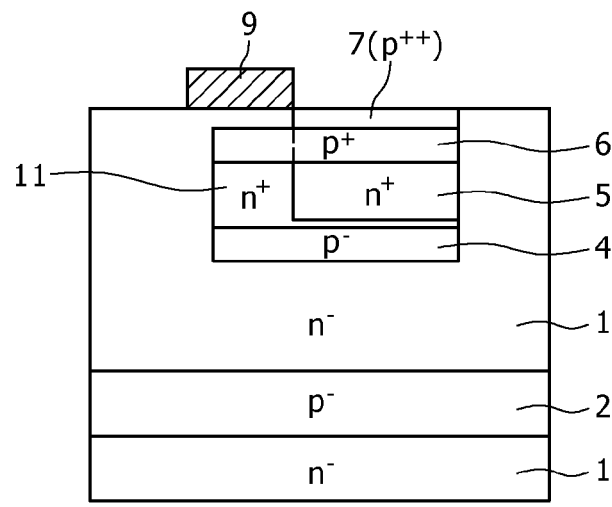

The next step is to form the transfer gate 9 and then to form the charge accumulating region 5 and the positive charge accumulating region 7 by ion implantation with n-type impurity and p-type impurity, respectively by using the transfer gate 9 as the mask, as shown in FIG. 8B. In this way there are formed the charge accumulating region 5 and the positive charge accumulating region 7 by self-alignment.

Incidentally, the transfer gate 9 is so formed as to extend over the region 11 of n⁺ type and the region 6 of p⁺ type, so that the region 11 of n⁺ type and the region 6 of p⁺ type extend under the transfer gate 9.

Figure 8C:
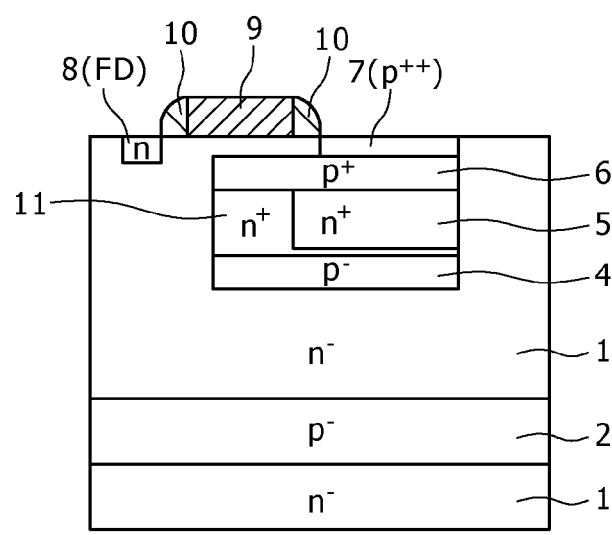

Subsequently, the side walls 10 are formed on the sides of the transfer gate 9, and the n-type floating diffusion 8 is formed by using the side walls 10 as the mask, as shown in FIG. 8C.

Finally, the element separating regions 3 are formed. In this way there is obtained the solid-state imaging element shown in FIG. 7.

Incidentally, the element separating regions 3 may be formed before the impurity regions 4, 5, 6, 7, 8, and 11 are formed.

Like the first embodiment, the fourth embodiment is characterized in that the region 11 of n⁺ type and the region 6 of p⁺ type thereon are formed by self-alignment and they extend under the transfer gate 9.

In addition, like the second embodiment, the fourth embodiment is characterized in that the region 4 of p⁻ type is also formed by self-alignment with the region 11 of n⁺ type and the region 6 of p⁺ type.

This structure permits the solid-state imaging element to be produced with a less number of masks and fabricating steps and also with a larger margin for mask alignment.

Accordingly, this contributes to cost reduction, time saving, and improved yields.

As in the first embodiment, the solid-state imaging element according to the fourth embodiment is capable of enhanced pinning under the transfer gate 9, which leads to improved charge transfer. Consequently, it obviates the necessity for the region 57 of n⁻ type shown in FIG. 16.

In addition, the region 11 of n⁺ type contributes to improved white spots and dark characteristics.

Moreover, as in the second embodiment, the region 4 of p⁻ type beneath the charge accumulating region 5 extends under the transfer gate 9.

Therefore, the region 4 of p⁻ type increases OFB between the photodiode and the floating diffusion, thereby increasing the saturation charge amount (Qs) of the photodiode. This leads to a higher value of OFB as compared with the solid-state imaging element shown in FIG. 16.

The transfer gate 9 may have its gate length reduced without any adverse effect on transfer owing to modulation by the region 11 of n⁺ type and action of the region 4 of p⁻ type. This makes it possible to reduce the pixel size by shortening the gate length of the transfer gate 9.

The solid-state imaging element according to this embodiment may be constructed such that a plurality (say, two or four) of pixels possess in common one floating diffusion (FD).

According to this embodiment, the region 4 of p⁻ type is formed under the charge accumulating region 5, and it reduces variation of pixel characteristics (such as Qs) even though a plurality of pixels possess in common one floating diffusion (FD) 8.

5. Fifth Embodiment

Figure 9:
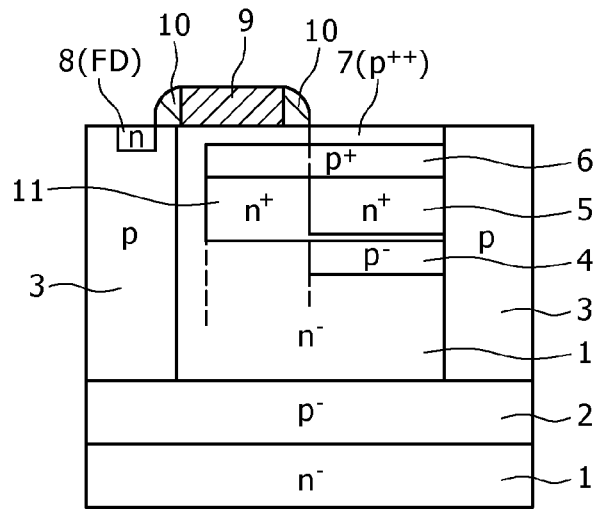
FIG. 9 is a schematic sectional view showing the structure of the solid-state imaging element according to the fifth embodiment of the present disclosure.

The solid-state imaging element according to the fifth embodiment of the present disclosure has a structure as shown in FIG. 9 which is a schematic sectional view.

According to this embodiment, the positive charge accumulating region 7 on the surface of the sensor section is formed by self-alignment with the region 4 of p⁻ type and the charge accumulating region 5. In addition, these three regions 4, 5, and 7 are aligned with the right edge of the side wall 10.

Except for this structure, it is identical with the one (shown in FIGS. 1 and 2) according to the first embodiment. The same constituents in FIGS. 9 and 10 are indicated by identical reference numerals and their description is omitted.

The solid-state imaging element according to the fifth embodiment of the present disclosure can be produced by the process described below.

Figure 10A:
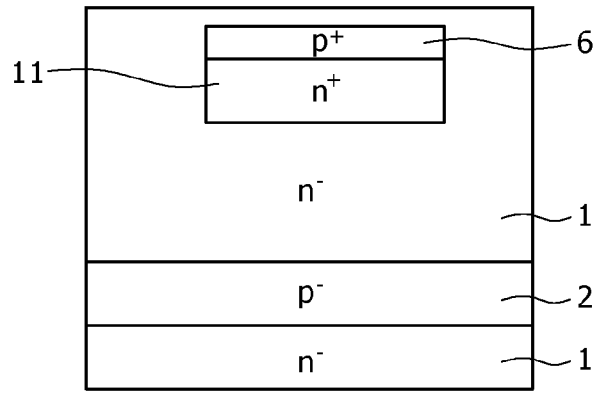
FIGS. 10A and 10B are diagrams showing the processing steps for production of the solid-state imaging element shown in FIG. 9.

The process shown in FIG. 10A is identical with that shown in FIG. 2A. The first step starts with forming the region 11 of n⁺ type and the region 6 of p⁺ type by ion implantation respectively with n-type impurity and p-type impurity through the same mask, as shown in FIG. 2A.

In this way the region 11 of n⁺ type and the region 6 of P⁺ type are formed by self-alignment.

Figure 10B:
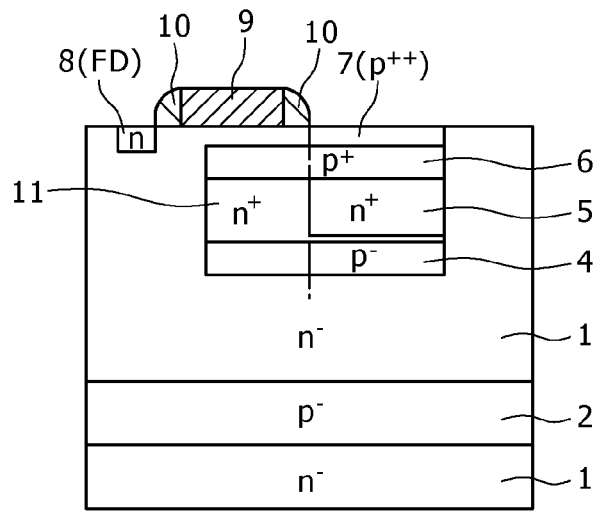

Next, the transfer gate 9 and the side walls 10 thereof are sequentially formed, as shown in FIG. 10B. Then, the region of p⁻ type, the charge accumulating region 5, the positive charge accumulating region 7, and the floating diffusion (FD) 8 are sequentially formed by using the side walls 10 as the mask. In other words, the region of p⁻ type, the charge accumulating region 5, and the positive charge accumulating region 7 are formed by self-alignment. It is desirable that the dose of p-type impurity in the region 4 of p⁻ type is lower than the dose of n-type impurity in the charge accumulating region 5 so that the impurity concentration in the region 4 of p-type is lower than the impurity concentration in the charge accumulating region 5.

Incidentally, the transfer gate 9 is formed to such an extent as to cover the region 11 of n⁺ type and the region 6 of p⁺ type. In this way there are obtained the region 11 of n⁺ type and the region 6 of p⁺ type which extend under the transfer gate 9.

Finally, the element separating regions 3 are formed. In this way there is obtained the solid-state imaging element shown in FIG. 9.

Incidentally, the element separating regions 3 may be formed before the impurity regions 4, 5, 6, 7, 8, and 11 are formed.

According to this embodiment, the region 11 of n⁺ type and the region 6 of p⁺ type thereon are formed by self-alignment, and they extend under the transfer gate 9.

Moreover, according to this embodiment, the region 4 of p⁻ type, the charge accumulating region 5, and the positive charge accumulating region 7 are formed by self-alignment.

The process mentioned above offers the advantage of reducing the number of masks and fabricating steps and increasing alignment margins.

Accordingly, this contributes to cost reduction, time saving, and improved yields.

Figure 16:
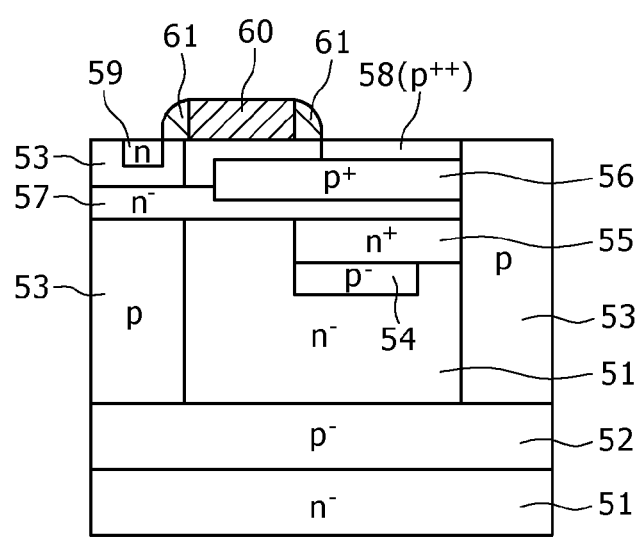
FIG. 16 is a schematic sectional view showing the structure of the solid-state imaging element.
Figure 17A:
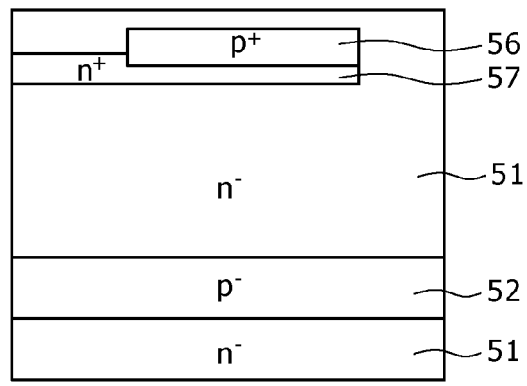
FIGS. 17A to 17C are diagrams showing the processing steps for production of the solid-state imaging element shown in FIG. 16.
Figure 17B:
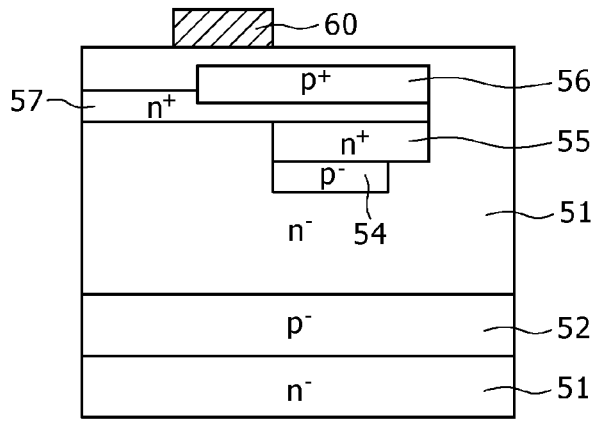
Figure 17C:
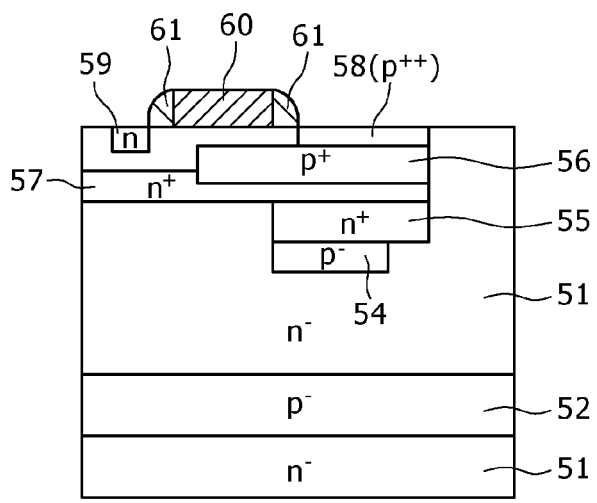
Figure 18A:
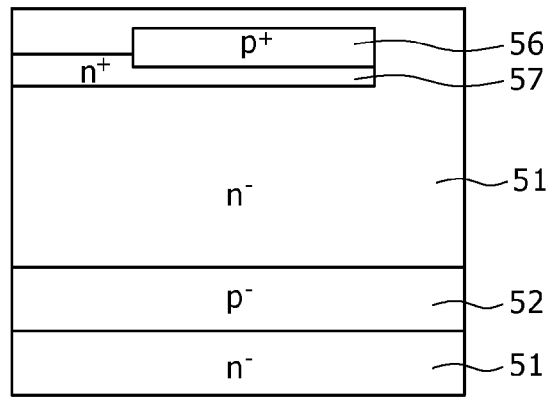
FIGS. 18A to 18C are diagrams showing the processing steps for production of the solid-state imaging element.
Figure 18B:
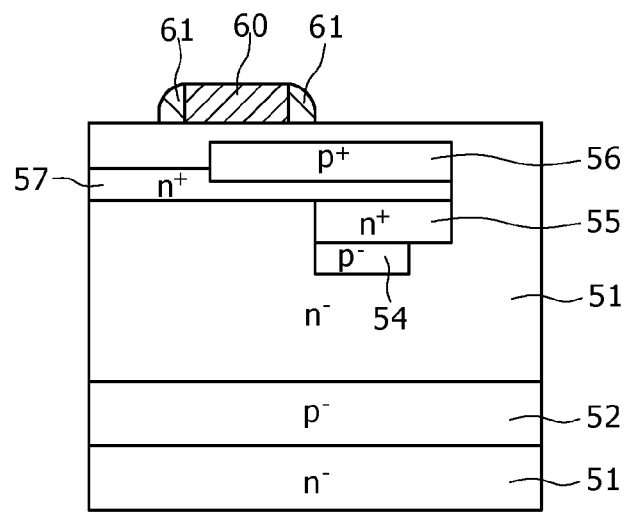
Figure 18C:
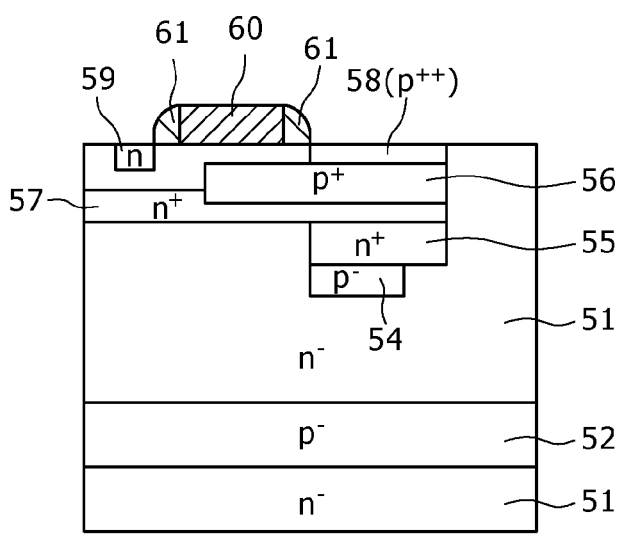

As in the first embodiment, this embodiment offers the advantage of enhancing pinning under the transfer gate 9, thereby improving charge transfer and obviating the necessity for the region 57 of n⁻ type shown in FIG. 16. In addition, the region 11 of n⁺ type helps improve white spots and dark characteristics.

The solid-state imaging element according to this embodiment may be constructed such that a plurality (say, two or four) of pixels possess in common one floating diffusion (FD).

According to this embodiment, the region 4 of p⁻ type is formed under the charge accumulating region 5, and it reduces variation of pixel characteristics (such as Qs) even though a plurality of pixels possess in common one floating diffusion (FD) 8.

6. Sixth Embodiment

Figure 11:
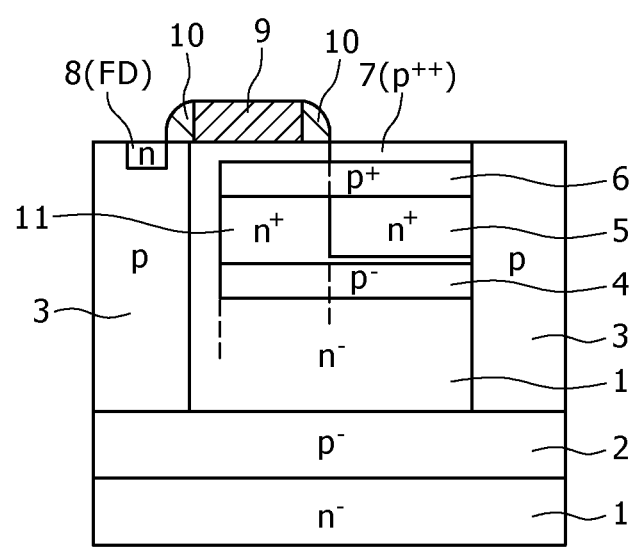
FIG. 11 is a schematic sectional view showing the structure of the solid-state imaging element according to the sixth embodiment of the present disclosure.

The solid-state imaging element according to the sixth embodiment of the present disclosure has a structure as shown in FIG. 11 which is a schematic sectional view.

According to this embodiment, the positive charge accumulating region 7 on the surface of the sensor section is formed by self-alignment with the charge accumulating region 5. In addition, these regions 5 and 7 are aligned with the right edge of the side wall 10.

Except for this structure, it is identical with the one (shown in FIGS. 3 and 4) according to the second embodiment. The same constituents are indicated by identical reference numerals and their description is omitted.

The solid-state imaging element according to this embodiment can be produced by the process explained below.

Figure 12A:
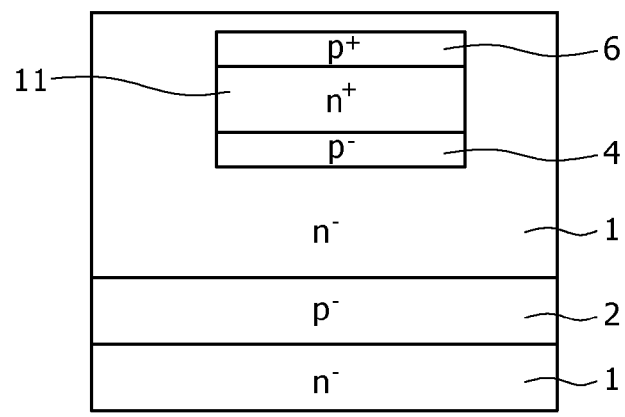
FIGS. 12A and 12B are diagrams showing the processing steps for production of the solid-state imaging element shown in FIG. 11.

The same steps as shown in FIG. 4A are carried out as shown in FIG. 12A. That is, the first step starts with forming the region 4 of p⁻ type by ion implantation with p-type impurity, the region 11 of n⁺ type by ion implantation with n-type impurity, and the region 6 of p⁺ type by ion implantation with p-type impurity through the same mask, as shown in FIG. 12A. In this way there are formed the region 4 of p⁻ type, the region 11 of n⁺ type, and the region 6 of P⁺ type by self-alignment.

Figure 12B:
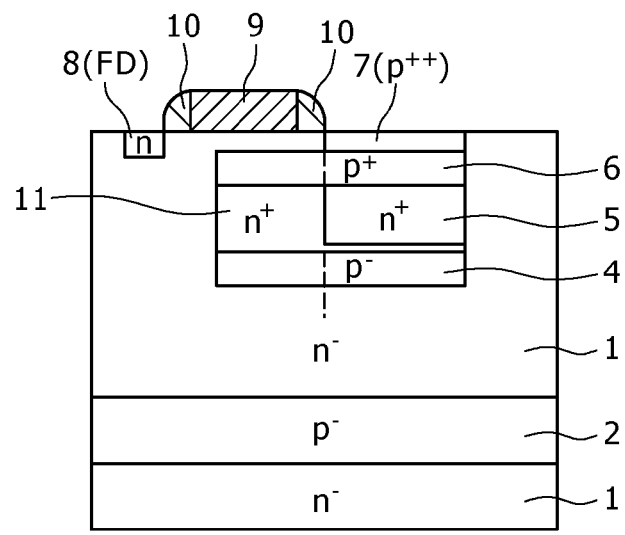

The next step, as shown in FIG. 12B, is to sequentially form the transfer gate 9 and the side walls 10 thereof. Then, the charge accumulating region 5, the positive charge accumulating region 7, and the floating diffusion (FD) 8 are sequentially formed by using the side walls 10 as the mask. In this way there are formed the charge accumulating region 5 and the positive charge accumulating region 7 by self-alignment.

Incidentally, the transfer gate 9 is so formed as to extend over the region 11 of n⁺ type and the region 6 of p⁺ type, so that the region 11 of n⁺ type and the region 6 of p⁺ type extend under the transfer gate 9.

Finally, the element separating regions 3 are formed. In this way there is obtained the solid-state imaging element shown in FIG. 11.

Incidentally, the element separating regions 3 may be formed before the impurity regions 4, 5, 6, 7, 8, and 11 are formed.

Like the first embodiment, the sixth embodiment is characterized in that the region 11 of n⁺ type and the region 6 of p⁺ type thereon are formed by self-alignment and they extend under the transfer gate 9.

In addition, like the second embodiment, the sixth embodiment is characterized in that the region 4 of p⁻ type is also formed by self-alignment with the region 11 of n⁺ type and the region 6 of p⁺ type.

This structure permits the solid-state imaging element to be produced with a less number of masks and fabricating steps and also with a larger margin for mask alignment. This contributes to cost reduction, time saving, and improved yields.

As in the first embodiment, the solid-state imaging element according to the sixth embodiment is capable of enhanced pinning under the transfer gate 9, which leads to improved charge transfer. Consequently, it obviates the necessity for the region 57 of n⁻ type shown in FIG. 16.

In addition, the region 11 of n⁺ type improves white spots and dark characteristics.

Moreover, as in the second embodiment, the region 4 of p⁻ type beneath the charge accumulating region 5 extends under the transfer gate 9.

Therefore, the region 4 of p⁻ type increases OFB between the photodiode and the floating diffusion, thereby increasing the saturation charge amount (Qs) of the photodiode. This leads to a higher value of OFB as compared with the solid-state imaging element shown in FIG. 16.

The transfer gate 9 may have its gate length reduced without any adverse effect on transfer owing to modulation by the region 11 of n⁺ type and action of the region 4 of p⁻ type. This makes it possible to reduce the pixel size by shortening the gate length of the transfer gate 9.

The solid-state imaging element according to this embodiment may be constructed such that a plurality (say, two or four) of pixels possess in common one floating diffusion (FD).

According to this embodiment, the region 4 of p⁻ type is formed under the charge accumulating region 5, and it reduces variation of pixel characteristics (such as Qs) even though a plurality of pixels possess in common one floating diffusion (FD) 8.

7. Seventh Embodiment

Figure 13:
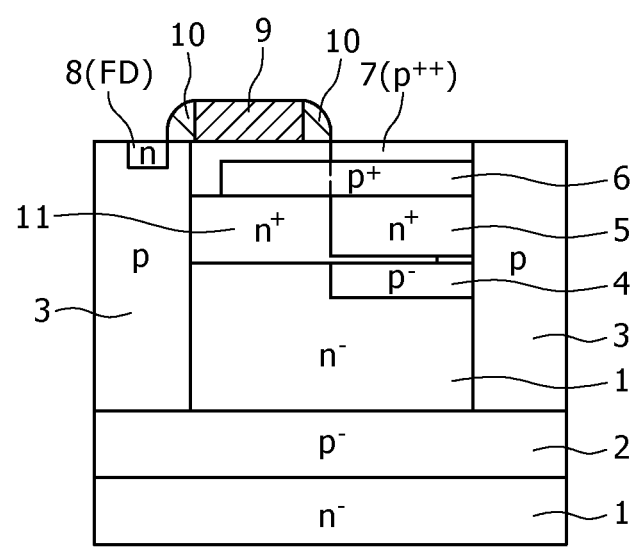
FIG. 13 is a schematic sectional view showing the structure of the solid-state imaging element according to the seventh embodiment of the present disclosure.

The solid-state imaging element according to the seventh embodiment of the present disclosure has a structure as shown in FIG. 13 which is a schematic sectional view.

According to this embodiment, the region 11 of n⁺ type is formed at a position which is displaced leftward with respect to the region 6 of p⁺ type. This displacement is achieved when the region 11 of n⁺ type is formed by ion implantation in an oblique direction through the same mask as used for the region 6 of p+ type.

Except for this structure, it is identical with the one (shown in FIGS. 1 and 2) according to the first embodiment. The same constituents are indicated by identical reference numerals and their description is omitted.

The solid-state imaging element according to this embodiment can be produced by the process explained below.

Figure 14A:
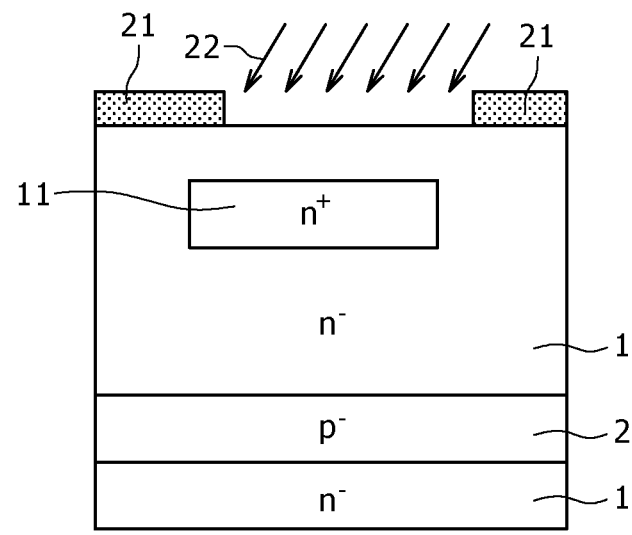
FIGS. 14A and 14B are diagrams showing the processing steps for production of the solid-state imaging element shown in FIG. 13.

The first step starts with forming the region 11 of n⁺ type by ion implantation 22 in an oblique direction (inclined leftward) through the resist mask 21 as shown in FIG. 14A.

Figure 14B:
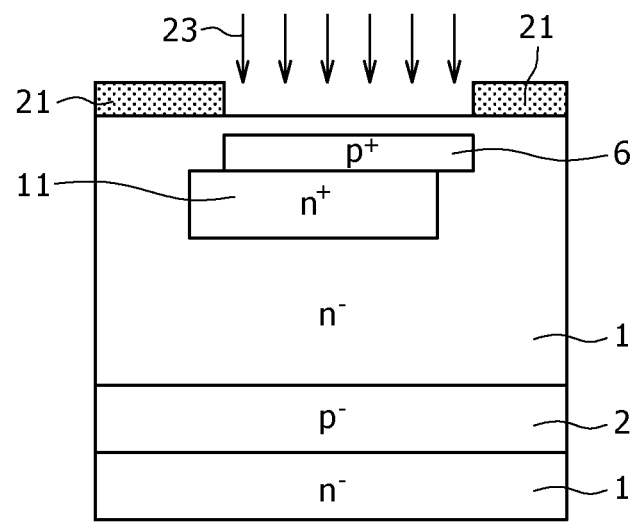

In the next step, the region 6 of p⁺ type is formed by ion implantation 23 in a downward direction through the same mask 21 as shown in FIG. 14B.

Thus, the region 11 of n⁺ type is formed which is displaced leftward with respect to the region 6 of p⁺ type.

Subsequently, the mask 21 is removed and the same steps as shown in FIGS. 2B and 2C are carried out and the element separating regions 3 are formed. In this way there is obtained the solid-state imaging element shown in FIG. 13.

The structure according to this embodiment is characterized in that the region 11 of n⁺ type and the region 6 of p⁺ type are so formed as to extend under the transfer gate 9.

As in the first embodiment, the solid-state imaging element according to the seventh embodiment is capable of enhanced pinning under the transfer gate 9, which leads to improved charge transfer. Consequently, it obviates the necessity for the region 57 of n⁻ type shown in FIG. 16.

In addition, the region 11 of n⁺ type improves white spots and dark characteristics.

According to this embodiment, the region 4 of p⁻ type, the charge accumulating region 5, and the positive charge accumulating region 7 are formed by self-alignment.

In addition, the region 11 of n⁺ type and the region 6 of p⁺ type thereon are formed by ion implantation through the same mask.

This structure permits the solid-state imaging element to be produced with a less number of masks and fabricating steps and also with a larger margin for mask alignment.

This contributes to cost reduction, time saving, and improved yields.

Incidentally, although the region 11 of n⁺ type is displaced leftward with respect to the region 6 of p⁺ type, these regions 11 and 6 may also be regarded as being formed by self-alignment because they are formed through the same mask 21.

In addition, according to this embodiment, the region 11 of n⁺ type is displaced leftward with respect to the region 6 of p⁺ type, and it is formed under the entire area of the transfer gate 9.

This structure improves the potential gradient under the transfer gate 9 and the charge transfer more than the structure in which the region 11 of n⁺ type is formed right under the region 6 of p⁺ type.

The solid-state imaging element according to this embodiment may be constructed such that a plurality (say, two or four) of pixels possess in common one floating diffusion (FD) 8.

According to this embodiment, the region 4 of p⁻ type is formed under the charge accumulating region 5, and it reduces variation of pixel characteristics (such as Qs) by the action of the region 4 of p⁻ type even though a plurality of pixels possess in common one floating diffusion (FD) 8.

According to each of the embodiments mentioned above, the region 11 of n⁺ type is formed slightly deeper than the charge accumulating region 5. This is achieved by ion implantation with a larger energy for the region 11 of n⁺ type than for the charge accumulating region 5.

The scope of the present disclosure is not restricted to what is mentioned above; however, it includes an instance in which the region 11 of n⁺ type is formed by ion implantation with an energy which is equal to, sufficiently larger than, or sufficiently smaller than that for ion implantation for the charge accumulating region 5.

According to each of the embodiments mentioned above, the region 4 of p⁻ type is formed by self-alignment with the region 11 of n⁺ type and the region 6 of p⁺ type, or with the charge accumulating region 5.

However, the present disclosure is not restricted to this structure; it covers the structure having the region 4 of p⁻ type formed wider toward FD 8 than the region 11 of n⁺ type and the region 6 of p⁺ type, or the structure having the region 4 of p⁻ type formed over the entire pixel region or over the entire chip of the solid-state imaging element.

Incidentally, in the case where the region 4 of p⁻ type is formed over the entire pixel region or the entire chip of the solid-state imaging element, there is no possibility of the region 4 of p⁻ type displacing from other impurity regions 5, 6, 7, and 11. This avoids a decrease in yields which results from the region 4 of p⁻ type displacing from other impurity regions 5, 6, 7, and 11.

Each of the foregoing embodiments is designed such that the impurity region of the first conduction type (or the region 11 of n⁺ type) and the charge accumulating region 5 of the first conduction type for the photodiode as the sensor section are of n-type, and the impurity regions of the second conduction type formed thereon (or the region 6 of p⁺ type and the positive charge accumulating region 7) are of p type.

However, the present disclosure may be modified such that the arrangement of the conduction type is reversed, that is, the impurity region of p type, the charge accumulating region, and the impurity regions of n type (or the region of n⁺ type and the negative charge accumulating region) are placed one over another.

8. Eighth Embodiment

Imaging Apparatus

Figure 15:
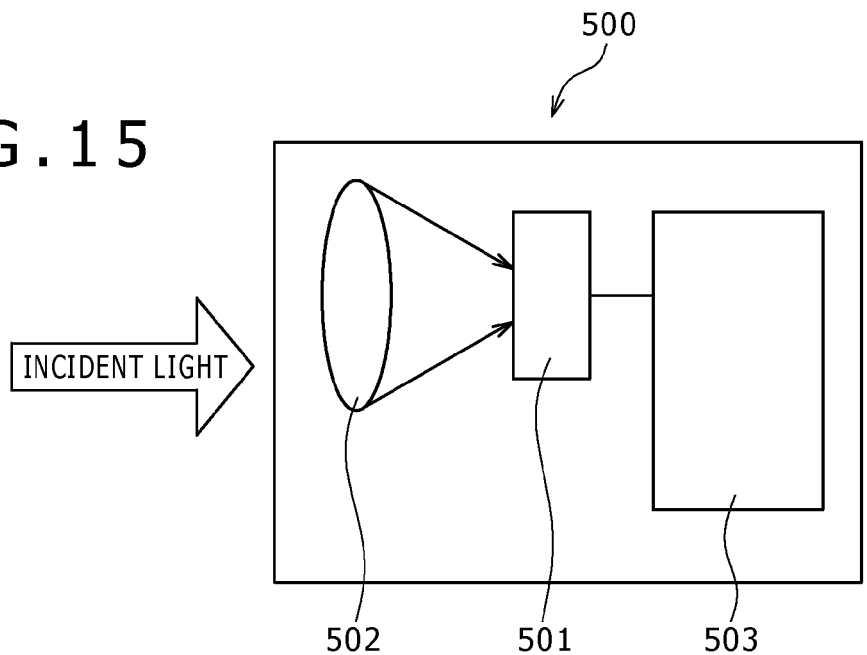
FIG. 15 is a schematic block diagram showing the structure of the imaging apparatus according to the eighth embodiment of the present disclosure.

The imaging apparatus according to the eighth embodiment is shown in FIG. 15, which is a schematic block diagram. This imaging apparatus includes video cameras, digital still cameras, and mobile phone cameras.

As shown in FIG. 15, the imaging apparatus 500 has the imaging unit 501 which is equipped with a solid-state imaging element (not shown). The imaging unit 501 has in its front part the image-forming optical system 502 to concentrate incident light and form an image. It also has in its rear part the signal processing unit 503 connected thereto which include circuits to drive the imaging unit 501 and circuits to process signals (resulting from photoelectric conversion by the solid-state imaging element) into images. The image signals processed by the signal processing unit 503 may be stored in an image storage (not shown).

The imaging apparatus 500 mentioned above may be provided with the solid-state imaging element according to any of the foregoing embodiments of the present disclosure.

The imaging apparatus 500 according to this embodiment is equipped with the solid-state imaging element of the present disclosure, which can be produced efficiently at low cost, at reduced time required and in high yields as mentioned above. Therefore, it is economical, stable, and highly reliable.

The imaging apparatus of the present disclosure is not restricted to the one constructed as shown in FIG. 15.

It may be modified in any way so long as it is equipped with the solid-state imaging element which may be of one-chip type or of module type including an imaging unit and a signal processing unit or optical system.

The imaging apparatus of the present disclosure may be applied to cameras and portable machines with an imaging function. Incidentally, "imaging" embraces the detection of finger prints.

The present disclosure is not restricted to the foregoing embodiments, but it may be variously changed and modified within its technical scope.

The present disclosure contains subject matter related to that disclosed in Japanese Priority Patent Application JP 2010-127324 filed in the Japan Patent Office on Jun. 2, 2010, the entire content of which is hereby incorporated by reference.

What is claimed is:

1. A solid-state imaging element having pixels, each including a sensor section that performs photoelectric conversion and a charge transfer section that transfers charges generated by said sensor section, said solid-state imaging element comprising:
   a semiconductor substrate of a first conductivity type with oppositely facing first and second surfaces;
   a transfer gate of said charge transfer section on the first surface of said semiconductor substrate;
   a charge accumulating region of the first conductivity type of said sensor section;
   a first impurity region of the second conductivity type which is formed at the first surface of said semiconductor substrate at said sensor section;
   a second impurity region of the second conductivity type which has a lower impurity concentration than said first impurity region of the second conductivity type, said second impurity region being formed (a) on said charge accumulating region and between said first impurity region of the second conductivity type and the charge accumulating region and extending under said transfer gate; and an impurity region of the first conductivity type which is formed in self-alignment with said second impurity region of the second conductivity type and extending under the transfer gate, said impurity region of the first conductivity type and said charge accumulating region overlapping such that said charge accumulating region is within said impurity region of the first conductivity type.

2. The solid-state imaging element of claim 1, wherein the first impurity region of the second conductivity type does not extend under the transfer gate.

3. The solid-state imaging element of claim 1, further comprising a second charge accumulating region of the second conductivity type under said impurity region of the first conductivity type.

4. The solid-state imaging element of claim 1, further comprising a well region of the second conductivity type in the semiconductor substrate between the entire sensor section and the second surface of the semiconductor substrate.

5. The solid-state imaging element of claim 1, further comprising element isolation regions isolating the sensor section within the semiconductor substrate.

6. The solid-state imaging element of claim 1, further comprising:
a well region of the second conductivity type in the semiconductor substrate between the entire sensor section and the second surface of the semiconductor substrate;
a second charge accumulating region of the second conductivity type under said impurity region of the first conductivity type; and
element isolation regions isolating the sensor section within the semiconductor substrate.

7. The solid-state imaging device of claim 1, wherein the first conductivity type is n-type and the second conductivity type is p-type.

8. A solid-state imaging element having pixels, each including a sensor section that performs photoelectric conversion and a charge transfer section that transfers charges generated by said sensor section, said solid-state imaging element comprising:
a semiconductor substrate of a first conductivity type with oppositely facing first and second surfaces;
a transfer gate of said charge transfer section on the first surface of said semiconductor substrate;
a charge accumulating region of the first conductivity type of said sensor section;
a first impurity region of the second conductivity type which is formed at the first surface of said semiconductor substrate at said sensor section;
a second impurity region of the second conductivity type which has a lower impurity concentration than said first impurity region of the second conductivity type, said second impurity region being formed on said charge accumulating region and under said first impurity region of the second conductivity type and extending under said transfer gate;
an impurity region of the first conductivity type which is formed by self-alignment with said second impurity region of the second conductivity type; and
a third impurity region of the second conductivity type which is formed under said charge accumulating region, wherein said third impurity region of the second conductivity type is formed by self-alignment with said charge accumulating region.

9. A solid-state imaging element having pixels, each including a sensor section that performs photoelectric conversion and a charge transfer section that transfers charges generated by said sensor section, said solid-state imaging element comprising:
a semiconductor substrate of a first conductivity type;
a transfer gate of said charge transfer section on the surface of said semiconductor substrate;
a charge accumulating region of the first conductivity type of said sensor section;
a first impurity region of the second conductivity type which is formed at the surface of said semiconductor substrate at said sensor section;
a second impurity region of the second conductivity type which has a lower impurity concentration than said first impurity region of the second conductivity type, said second impurity region being formed on said charge accumulating region and under said first impurity region of the second conductivity type and extending under said transfer gate; and
an impurity region of the first conductivity type which is formed in self-alignment with said second impurity region of the second conductivity type,
wherein,
said impurity region of the first conductivity type is so formed at to be displaced toward said transfer gate from said second impurity region of the second conductivity type.

10. An imaging apparatus comprising:
a light collecting section configured to collect incident light;
a solid-state imaging element having pixels, each including a sensor section that performs photoelectric conversion and a charge transfer section that transfers charges generated by said sensor section, said solid-state imaging element including (a) a semiconductor substrate of a first conductivity type with oppositely facing first and second surfaces, (b) a transfer gate of said charge transfer section on the first surface of said semiconductor substrate, (c) a charge accumulating region of the first conductivity type of said sensor section, (d) a first impurity region of the second conductivity type which is formed at the first surface of said semiconductor substrate at said sensor section, (e) a second impurity region of the second conductivity type which has a lower impurity concentration than said first impurity region of the second conductivity type, said second impurity region being formed on said charge accumulating region and between said first impurity region of the second conductivity type and the charge accumulating region and extending under said transfer gate, and (f) an impurity region of the first conductivity type which is formed in self-alignment with said second impurity region of the second conductivity type; and extending under the transfer gate, said impurity region of the first conductivity type and said charge accumulating region overlapping such that said charge accumulating region is within said impurity region of the first conductivity type; and
a signal processing section configured to process signals resulting from photoelectric conversion by said solid-state imaging element.

* * * * *